(12) United States Patent
Marholev et al.

(10) Patent No.: US 8,929,808 B2
(45) Date of Patent: Jan. 6, 2015

(54) ANTENNA DRIVER CIRCUIT FOR NFC READER APPLICATIONS

(75) Inventors: Bojko Marholev, Lomma (SE); Aminghasem Safarian, Tustin, CA (US)

(73) Assignee: Broadcom Corporation, Irvine, CA (US)

( * ) Notice: Subject to any disclaimer, the term of this patent is extended or adjusted under 35 U.S.C. 154(b) by 302 days.

(21) Appl. No.: 13/249,043

(22) Filed: Sep. 29, 2011

(65) Prior Publication Data

US 2013/0084799 A1    Apr. 4, 2013

(51) Int. Cl.
*H04B 5/00* (2006.01)
*H03F 3/45* (2006.01)
*H03F 3/24* (2006.01)

(52) U.S. Cl.
CPC ............ *H03F 3/245* (2013.01); *H03F 3/45179* (2013.01); *H03F 2203/45424* (2013.01); *H03F 2203/45421* (2013.01); *H03F 3/45641* (2013.01); *H04B 5/0075* (2013.01); *H03F 2200/411* (2013.01)
USPC .......................... 455/41.1; 330/259; 709/217

(58) Field of Classification Search
CPC ..... H04W 4/008; H04W 12/00; H04W 24/00; H04B 5/00; H04B 5/0056; H04B 5/0075
USPC .......... 455/41.1, 41.2, 343.5, 194.2; 330/259; 704/222, 226, 230; 709/217; 388/811; 370/212, 282
See application file for complete search history.

(56) References Cited

U.S. PATENT DOCUMENTS

| | | | | |
|---|---|---|---|---|
| 7,215,199 B2 * | 5/2007 | Marholev | ...................... | 330/258 |
| 7,881,665 B2 * | 2/2011 | Symons | ...................... | 455/41.1 |
| 8,150,321 B2 * | 4/2012 | Winter et al. | ................ | 455/41.2 |
| 8,180,285 B2 * | 5/2012 | Rofougaran | ................ | 455/41.1 |
| 8,190,086 B2 * | 5/2012 | Sasaki et al. | ................. | 455/41.1 |
| 8,233,842 B2 * | 7/2012 | Symons | ...................... | 455/41.1 |
| 8,249,500 B2 * | 8/2012 | Wilson | ......................... | 455/41.1 |
| 8,249,524 B2 * | 8/2012 | Darwhekar et al. | ............ | 455/78 |
| 8,311,504 B2 * | 11/2012 | Rofougaran | ............... | 455/277.1 |
| 8,326,224 B2 * | 12/2012 | Butler | .......................... | 455/41.1 |
| 8,422,946 B2 * | 4/2013 | Bangs et al. | ................. | 455/41.1 |
| 8,432,293 B2 * | 4/2013 | Symons | .................... | 340/854.8 |
| 8,466,791 B2 * | 6/2013 | Goto et al. | ................. | 340/572.7 |
| 8,472,873 B2 * | 6/2013 | Tzoreff et al. | ............... | 455/41.1 |
| 8,496,141 B2 * | 7/2013 | McKay et al. | ............. | 222/144.5 |
| 8,633,766 B2 * | 1/2014 | Khlat et al. | .................... | 330/127 |
| 8,633,768 B2 * | 1/2014 | Takahashi | ..................... | 330/136 |
| 2010/0254481 A1 * | 10/2010 | Nakagawa | .................... | 375/295 |

* cited by examiner

*Primary Examiner* — Marceau Milord
(74) *Attorney, Agent, or Firm* — Sterne, Kessler, Goldstein & Fox P.L.L.C.

(57) ABSTRACT

A power amplifier, supplied by a supply voltage, to drive an antenna to output a magnetic field, comprising a differential stage configured to output an output signal to drive the antenna, and a feedback stage configured to receive a common mode output voltage from the differential stage and to output a feedback voltage to regulate the output common mode signal to be proportional to the supply.

19 Claims, 5 Drawing Sheets

ANTENNA DRIVER CIRCUIT FOR NFC READER APPLICATIONS

BACKGROUND OF THE INVENTION

1. Field of the Invention

The present invention relates to the design of an antenna driver used in a Reader Tx block of an NFC (near field communication) device. The antenna driver, which is part of the Reader Tx block, drives an antenna to output a magnetic field to establish communication with a Tag Tx block included in another NFC device.

2. Background Art

FIG. 1A shows a conventional communication system 100 including two NFC devices 110, 120 for communicating with each other. Each of the NFC devices 110, 120 includes a Tag Tx block 112, 122, a Reader Tx block 114, 124, a Reader Rx block 116, 126, and a Tag Rx block 118, 128 along with other supporting circuitry (not shown). The communication between the NFC devices 110, 120 is initiated when an antenna driver included in a Reader Tx block drives an antenna of one of the NFC devices to output a magnetic field that can power a Tag Rx and Tx-block included in the other NFC device. The communication is established when the powered Tag Tx block modulates the magnetic field with a communications signal and transmits the modulated signal to the Reader Rx block. For example, to initiate communication, the Reader Tx1 block 114 includes an antenna driver that drives an antenna associated with the NFC device 110 to output a magnetic field that powers the Tag Tx2 block 122 and Tag Rx2 block 128 included in the NFC device 120. The communication is established when the Tag Tx2 and Rx2 are powered by the output magnetic field, and when Tag Tx2 block_122 load modulates the magnetic field with a communications signal which is read back by the Reader Rx1 block 116.

Alternatively, in the communication system 150 illustrated in FIG. 1B, the NFC device 110 may communicate with a Radio-Frequency Identification (RFID) device. The RFID device 130 a Tag 134, and other circuitry (not shown). The communication between the NFC device 110 and the RFID device 130 is similar to the communication between the NFC device 110 and the NFC device 120 discussed above. In particular, to initiate communication, the Reader Tx1 block 114 includes an antenna driver that drives an antenna associated with the NFC device 110 to output a magnetic field that powers the Tag block 134 included in the RFID device 130. The communication is established when the Tag block 134 is powered by the output magnetic field, and when Tag block 134 modulates the magnetic field with a communications signal and transmits the modulated signal back to Reader Rx1 block 114. The RFID device 130 can be similar to a RFID device according to ISO 14443, ISO 15693, or a contactless RFID smart card.

FIG. 2 shows a conventional topology of the Reader Tx block 114 included in the NFC device 110. The NFC device 110 also includes a battery 220 and an antenna driver 240, where the antenna driver 240 includes a power amplifier (PA) 230 powered by the low-dropout regulator (LDO) 210, the LDO 210 being powered by the battery 220. The power amplifier 230 of the antenna driver 240 drives the antenna 200 with an electrical signal to output the magnetic field, and initiate communication with the Tag Tx2 block 122 and Tag Rx2 block 128 included in the NFC device 120. In order to power the Tag Tx2 and Rx2 blocks 122 and 128, the antenna 200 is required to output a very strong magnetic field due to system inefficiencies and other factors such as the distance between the communicating NFC devices 110, 120. Therefore, the power amplifier 230 is required to drive the antenna 200 with a high voltage and current to output a high magnetic field. However, in the conventional topology, the driving capability of the power amplifier 230 is limited by the maximum LDO 210 output voltage ($V_{LDOmax}$) which can be significantly lower than the maximum battery voltage ($V_{Batmax}$). As such, to output a magnetic field at a given amount of power, the power amplifier 230 is required to output a higher amount of current due to the limitation in the driving voltage, which is inefficient given that a larger battery voltage of 5.5V is available.

FIG. 2 also shows a graph of output voltage for power amplifier 230 in the conventional topology. Because the power amplifier 230 is powered by the LDO 210 having a maximum voltage of 2.5V, the peak-to-peak output from the power amplifier 230 cannot exceed 2.5V. Further, in practice, the output voltage of the LDO 210 ($V_{LDOreg}$) is regulated to be lower than the minimum battery voltage (during a normal discharge cycle) to prevent the LDO 210 from dropping out and clipping the output of the power amplifier 230. The minimum battery voltage may reach as low at 2.5 volts during discharge, and therefore $V_{LDOreg}$ may be set as low at 2.0V. As such, during the complete operation range of the battery voltage from 2.5V to 5.5V, the maximum peak-to-peak output from the conventional power amplifier 230 remains constant at the regulated voltage ($V_{LDOreg}$) which is below the minimum battery voltage. In particular, the peak-to-peak voltage output by the power amplifier 230 remains constant at $V_{LDOreg}$ of about 2V and is not capable of tracking the changes in the battery voltage. Therefore, due to the limitation in output voltage, in the conventional topology, a higher amount of current is required to output the magnetic field at the given amount of power. The conventional topology does not allow for reduction in the overall current consumption of the circuit leading to the circuit being very inefficient.

Therefore, there is a need to improve the efficiency of the antenna driver design by reducing the overall current consumption, while providing a sufficient electrical signal to drive the antenna for magnetic field generation.

BRIEF SUMMARY OF THE INVENTION

In an exemplary embodiment, the present invention includes a power amplifier, supplied by a supply voltage, to drive an antenna to output a magnetic field. The power amplifier includes a pseudo-differential stage configured to output an output signal to drive the antenna, and a feedback stage configured to receive a common mode output voltage from the pseudo-differential stage and to output a feedback voltage to regulate the output signal to be proportional to the supply.

In another exemplary embodiment, the present invention includes a near field communication (NFC) device comprising an antenna configured to output a magnetic field to establish communication with another NFC device. A power amplifier, supplied by a supply voltage, drives the antenna to output the magnetic field, the power amplifier including a pseudo-differential stage configured to output an output signal to drive the antenna, and a feedback stage configured to receive a common mode output voltage from the pseudo-differential stage and to output a feedback voltage to regulate the output signal to be proportional to the supply voltage.

In a further exemplary embodiment, the present invention includes a power amplifier, supplied by a supply voltage, to drive an antenna to output a magnetic field, comprising means for outputting an output signal to drive the antenna; and means for receiving a common mode output voltage from the means for outputting, and to output a feedback voltage to regulate the output signal to be proportional to the supply voltage.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION OF THE INVENTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

As discussed above, there is a need to improve the efficiency of the design in outputting a strong magnetic field to establish communication with another NFC device by reducing the overall power consumption in the design. To that end, Applicants have invented a design, an embodiment of which is shown in FIG. 3.

Figure 3:
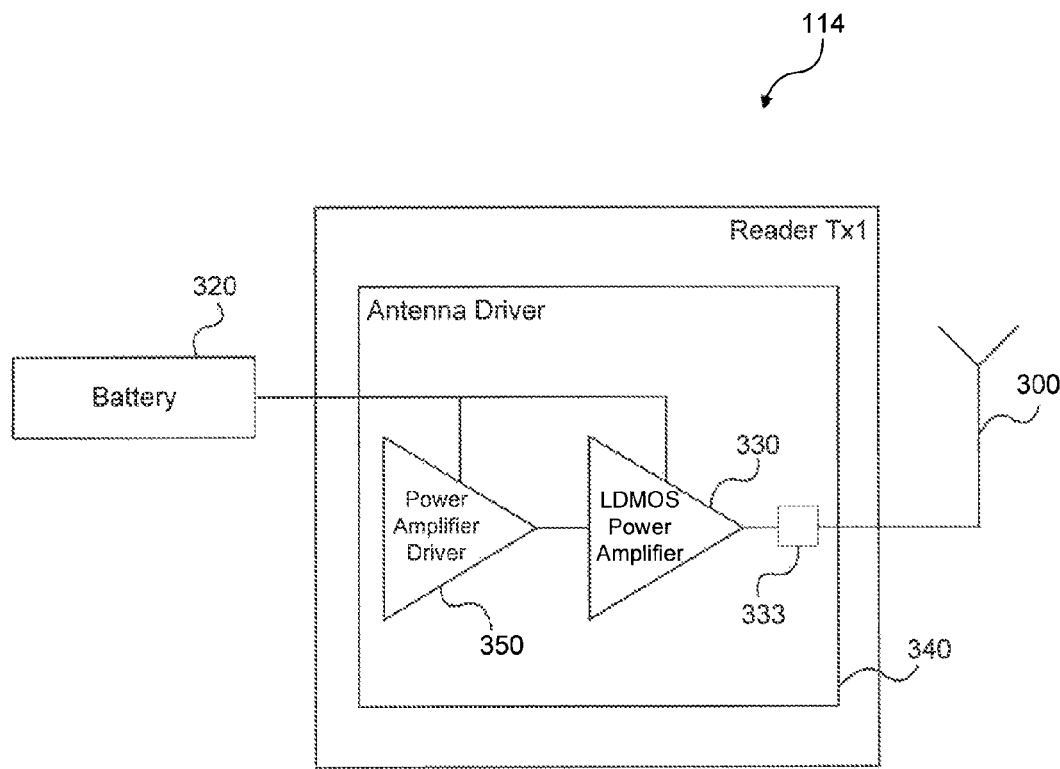
FIG. 3 illustrates a block diagram of an exemplary Reader Tx block according to an embodiment of the present invention.
Figure 3:
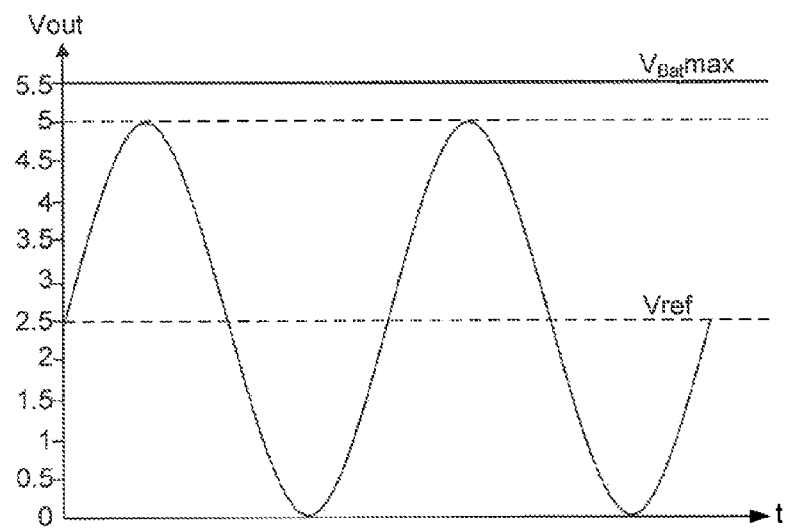

FIG. 3 shows an inventive embodiment of the Reader Tx block 114 including an antenna driver 340. The antenna driver 340 includes a power amplifier driver 350 and a power amplifier 330 to drive the antenna 300. In this embodiment, the power amplifier driver 350 and the power amplifier 330 are directly powered by the battery 320 of the NFC device, without any intervening voltage regulator.

Since the power amplifier 330 is powered directly by the battery 320, the power amplifier is operational throughout the battery supply voltage range (of 2.5V to 5.5V), and is not limited to the regulated LDO output voltage ($V_{LDOreg}$ of about 2.0V). This higher range of voltage during operation allows the power amplifier 330 to drive the antenna 300 to output a magnetic field at the given amount of power with a reduced current. That is, because the voltage is increased from a regulated constant peak-to-peak voltage of about 2.0V to a maximum peak-to-peak voltage of about 5.5V, the current required to output the magnetic field at the given amount of power can be reduced. One can appreciate that such a reduction in current is not possible in the conventional topology using the LDO 210 which has a constant regulated voltage of about 2.0V, In this way, the current required to output a strong magnetic field to establish communication with another NFC device is significantly reduced, thereby improving the overall current consumption and the efficiency of the design. Another advantage of being able to supply the antenna driver directly from the battery is that the LDO is eliminated completely which would reduce the die area and overall cost of the system.

Figure 1A:
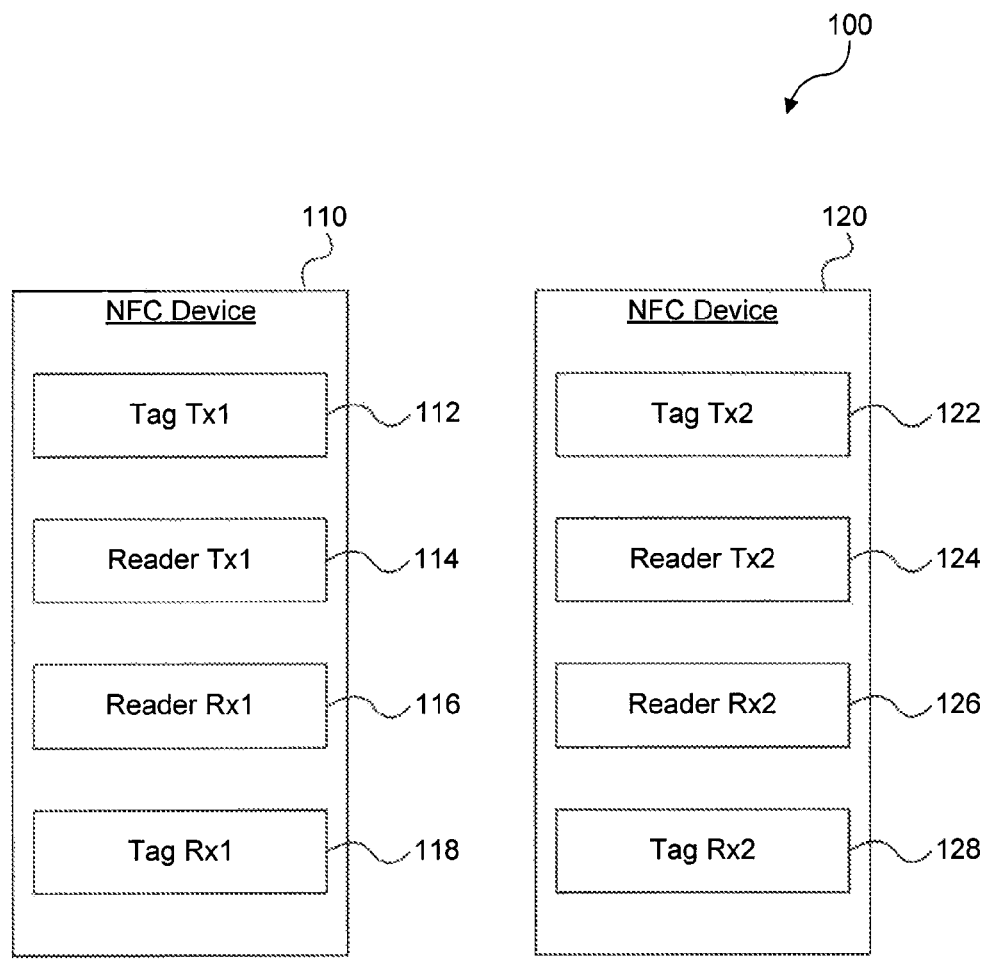
FIG. 1A illustrates a block diagram of a conventional communication system 100 including NFC devices 110, 120.
Figure 1B:
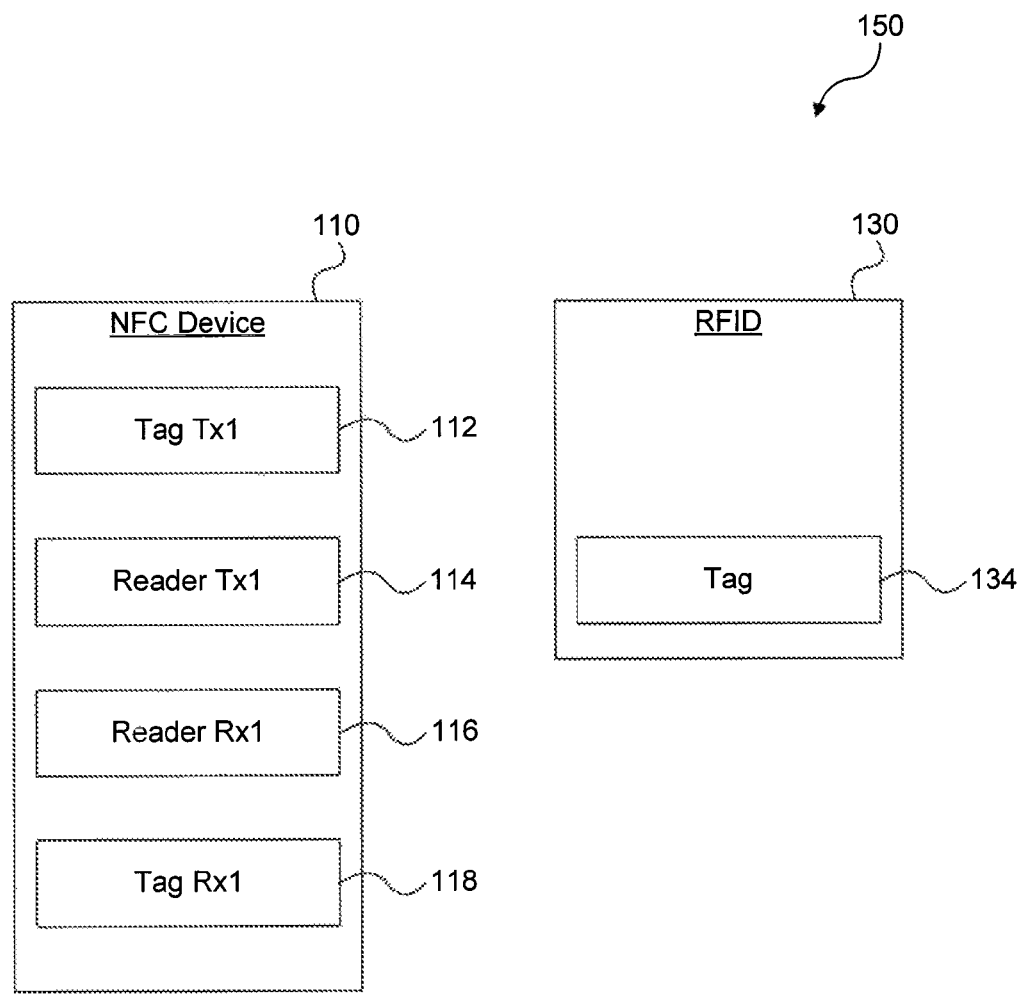
FIG. 1B illustrates a block diagram of a conventional communication system 150 including an NFC devices 110 and a RFID device 130.
Figure 2:
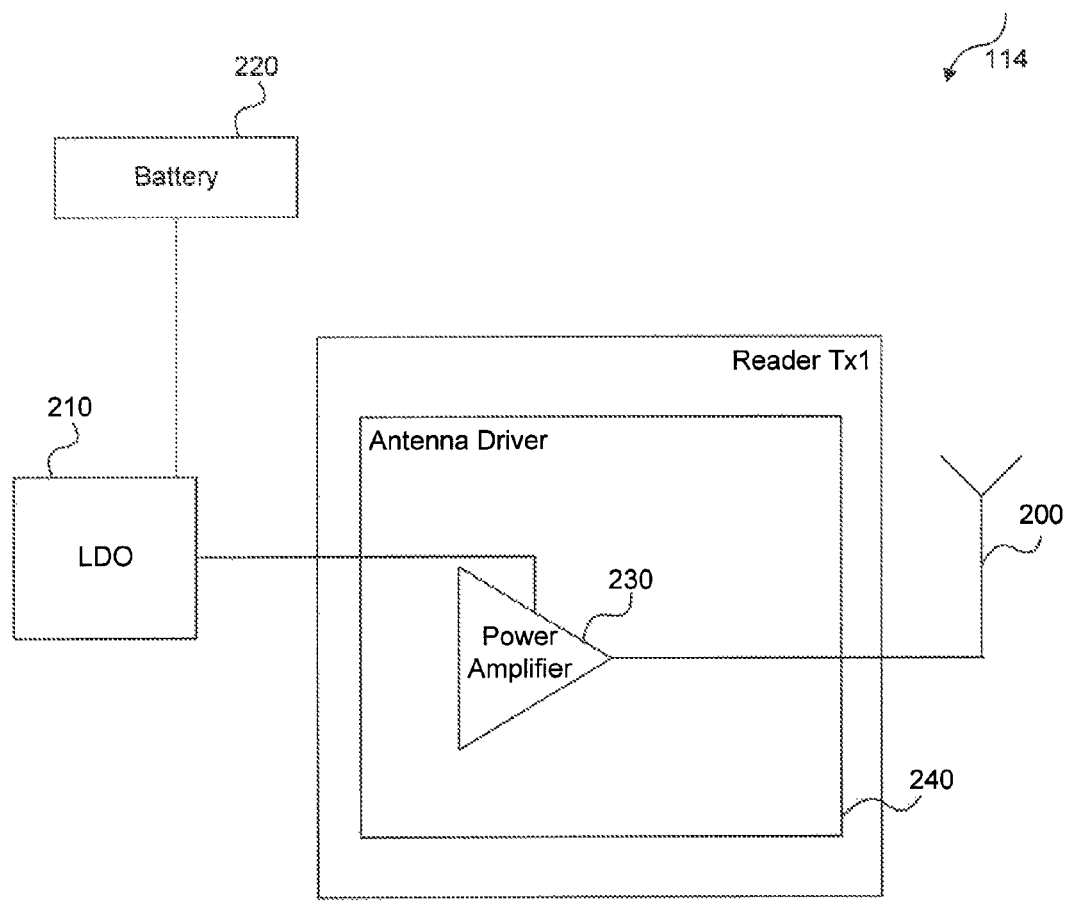
FIG. 2 illustrates a block diagram of a conventional Reader Tx block included in a conventional NFC device 110, 120.
Figure 2:
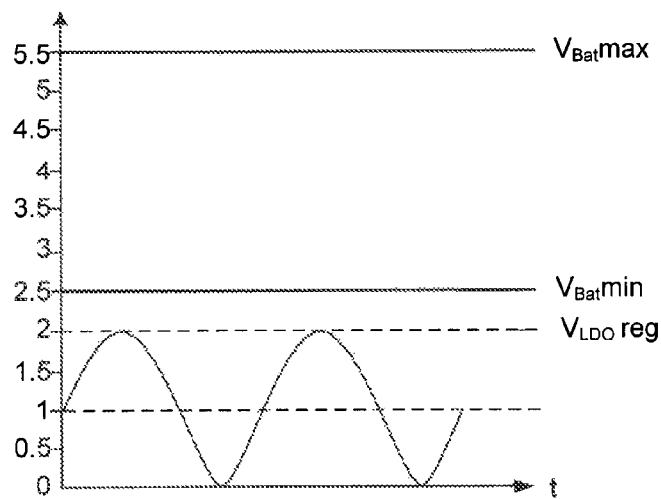

FIG. 3 also shows the graph of output voltage of the power amplifier 330. In contrast to the graph in FIG. 2, the output peak-to-peak voltage of the power amplifier 330 is not limited to a constant lower voltage and is able to track changes in the supply (battery) voltage. That is, the output peak-to-peak voltage of the power amplifier 330 changes from a minimum of 2.5V peak-to-peak to a maximum of 5.5V peak-to-peak. As such, the output voltage of the power amplifier 330 is increased which allows for the reduction in the overall current consumption to output a magnetic field at the given power, thereby improving the efficiency of the design.

Conventionally, a power amplifier is not directly powered by a battery because of a certain design concerns. For example, the components of the power amplifier are not rated for voltages higher than about 3.5V and would be destroyed if exposed to the maximum battery voltage of about 5.5V. Another concern is that directly powering the power amplifier by the battery may allow the supply (battery) voltage to be coupled to the output of the power amplifier. However, Applicants have designed the power amplifier driver 350 and the power amplifier 330 to include LDMOS (laterally diffused metal oxide semiconductors) devices which are rated to operate at supply voltages of up to 5.5V, and are designed to isolate the (battery) input voltage from the (power amplifier) output voltage. Therefore, in Applicants' inventive design, the power amplifier 330 can be directly powered by the battery 320 without violating the above design concerns.

The antenna can simply be modeled as a coil with a defined inductance and Quality factor and there is usually a need to transform the antenna impedance to a lower value at the driver output and also resonance the antenna at the given operating frequency. This is accommodated by an impedance transformation network 333 between the antenna driver 340 and the actual antenna 300. The impedance transformation ratio and the driver load impedance are defined by the amount of voltage swing available from the driver output stage and the desired output power. The higher output voltage range of the power amplifier 330 would result in an increase in the required load impedance for a given output power. Specifically, from the antenna's point of view, at a given voltage, the reduction in the design's current consumption allows the transformed impedance of the antenna to be higher without affecting the power of the output magnetic field. This reduces the severity of the impedance transformation network that is needed between the power amplifier and the antenna, and improves the overall efficiency thereof.

Figure 4:
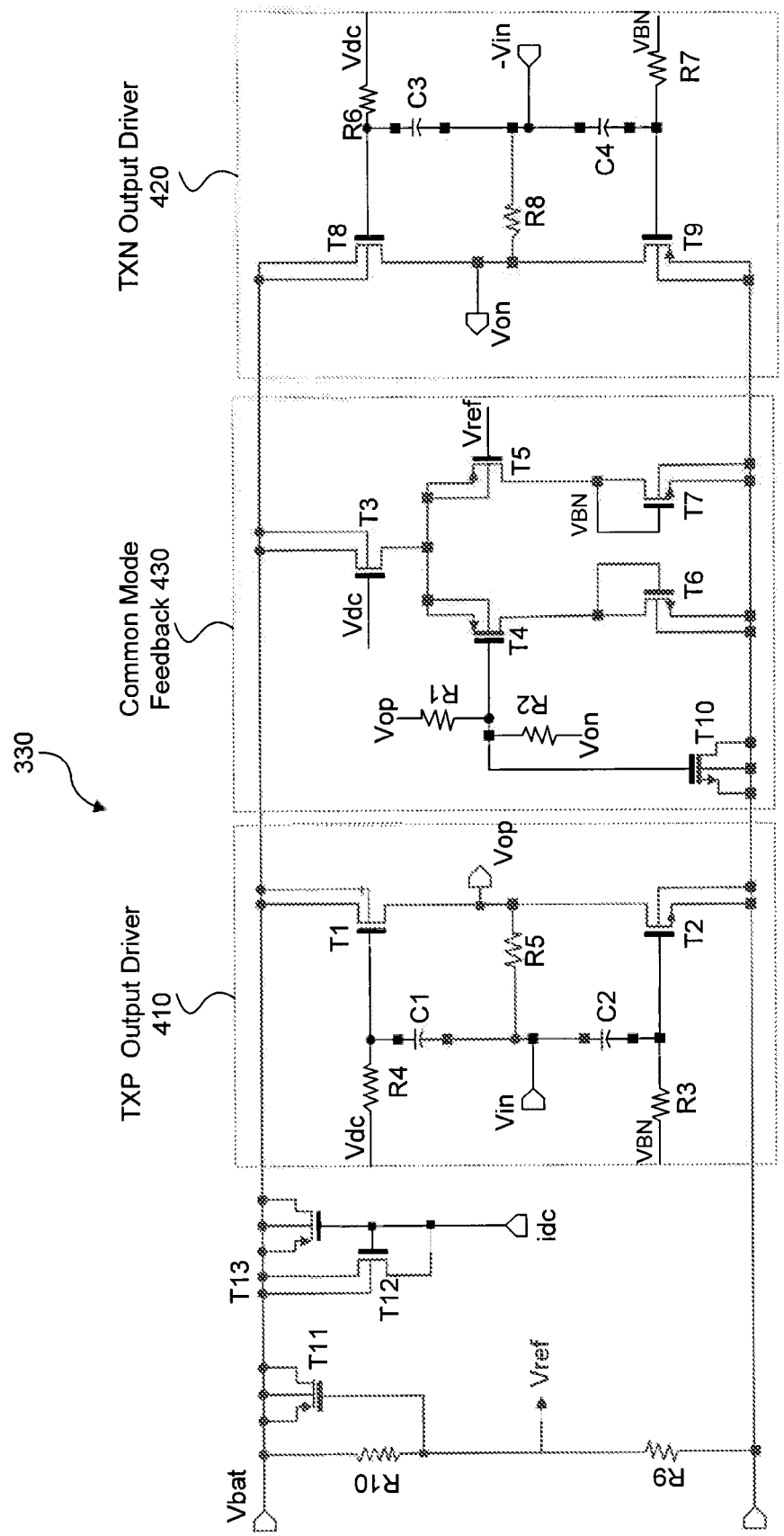
FIG. 4 illustrates an exemplary design of the power amplifier 330 according to an embodiment of the present invention.

The functioning of the antenna driver 340, shown in FIG. 4, will now be explained in further detail. The power amplifier 330 in the antenna driver 340 includes a pseudo-differential amplifier including complementary driver stages 410, 420, a common mode (CM) feedback stage 430, and biasing circuitry. The complementary driver stage 410 includes biasing resistors R3 and R4, an LDMOS-P transistor T1 having an input voltage Vdc, ac-coupling capacitors C1 and C2, a shunt feedback resistor R5, and an LDMOS-N transistor T2 having an input voltage VBN. The transistors T1 and T2 are coupled together at their respective drains, and form the positive output voltage Vop.

Similarly, the complementary driver stage 420 includes biasing resistors R6 and R7, an LDMOS-P transistor T8 having the input voltage Vdc, ac-coupling capacitors C3 and C4, a shunt feedback resistor R8, and an LDMOS-N transistor T9 having the input voltage VBN. The common mode feedback stage includes resistors R1 and R2, a differential pair of LDMOS-P transistors T4 and T5, a pair of diode connected LDMOS-N transistors T6 and T7, and biasing LDMOS transistor T3. The capacitance of transistor T10 in conjunction with R1 and R2 are forming a low pass filtering function of the common mode voltage. The dc biasing is set by an external current source (not shown) connected to input Idc, LDMOS transistors T12, and T13.

Resistors R9 and R10 form a voltage divider with respect to the (battery) supply voltage to output a reference voltage (Vref). Resistors R9 and R10 can have fixed values or be programmed in real time to adjust the value of the reference voltage Vref. Transistor T11 is included to provide some filtering of the reference voltage Vref. This reference voltage Vref is provided as an input to the differential pair LDMOS-P transistor T5 of the common mode feedback stage 430.

Each of the driver stages 410, 420 and the common mode feedback stage 430 is provided with a reference bias voltage Vdc at the respective LDMOS-P transistors T1, T8, and T3 to facilitate operation of each of these stages. The reference bias voltage Vdc is derived, using LDMOS transistors T12, from a reference bias current (Idc) provided by an external current source (not shown).

The complementary driver stages 410, 420 are inverter stages operating on the opposite cycles of the waveform of the input signal Vin. For instance, the TXP output driver 410 drives the antenna 300 using the positive cycle of the input signal Vin, and the TXN output driver 420 drives the antenna 300 using the negative cycle of the input signal—Vin, having a 180° phase difference with respect to the positive cycle of the input signal Vin. The respective outputs Vop, Von produce amplified and inverted versions of the input signals so as to drive the antenna 300 to output the magnetic field. In one embodiment, when Vop is at its maximum voltage, Von is at its minimum voltage, and vice versa.

The driver stages 410, 420 are included in the pseudo-differential stage, in which each driver stage 410, 420 may operate independently in the single-ended mode. That is, each driver stage 410, 420 may operate independently such that when the positive cycle of the input signal Vin at the input of driver stage 410 is held constant and the negative cycle of the input signal Vin is applied at the input of the driver stage 420, the output of the driver stage 410 remains constant while the output of the driver stage 420 produces signal swing to drive the output Yon. That is only Von swings, when Vin of Txp 410 is held constant. Therefore, each driver stage 410, 420 operates independently and the overall amplifier has minimal common-mode rejection. Conversely, in a conventional differential amplifier, when the positive cycle of the input signal Vin at the input of driver stage 410 is held constant and the negative cycle of the input signal Yin is applied at the input of the driver stage 420, both outputs Von, Vop have signal swing and none of the outputs of the driver stages remains constant, therefore, giving rise to common-mode rejection. This independent operation of driver stages 410, 420 with minimal common mode rejection is referred to as a "pseudo-differential", because of the deviations from a conventional differential amplifier explained above.

The common mode feedback stage 430 enables the utilization of the complete supply voltage range (2.5V-5.5V) by regulating the common mode voltage of the complementary driver stages 410, 420 to be proportional to the supply voltage, i.e., the battery voltage. For example, the common mode feedback stage 430 can regulate the common mode voltage to be at half the supply voltage. This is accomplished by setting the values of R8 and R9 to generate a reference voltage Vref that is half the supply voltage. The common mode feedback stage 430 compares the inputted reference voltage Vref and the common mode output voltage from the complementary driver stages 410, 420. As a result of the comparison, the common mode feedback stage 430 outputs feedback voltage VBN to each of the complementary driver stages 410, 420 to regulate the common mode voltage to be equal to the reference voltage Vref, and therefore proportional to the supply voltage.

Specifically, the common mode voltage provided at one of the differential inputs of the common mode feedback stage 430 (at the gate of T4) is generated by the network R1, R2 and T10 from the output Vop of the driver stage 410 and the output Von of the driver stage 420. The other differential input of the common mode feedback stage 430 is provided with the reference voltage (Vref), which is proportional to the supply voltage. The common mode feedback stage 430 then compares the two input voltages, and regulates the common mode voltages at Vop and Von to be equal to the reference voltage Vref. To regulate the common mode voltage, the output VBN of the common mode feedback stage 430 is fed back to the gates of LDMOS-N transistors T2, T9 of the respective driver stages 410, 420. This in turn results in modulation of the output voltages Vop. Von output by the driver stages 410, 420 respectively. In this example, the total output including the outputs Vop, Von of each complementary stage 410, 420 is centered at the reference voltage Vref and respectively tracks the positive half and negative half of the input voltage Vin. It is reminded that Vref is voltage divided from Vbattery by R9 and R10. As such, as the battery voltage changes, the maximum usable peak-to-peak output of power amplifier 330 tracks the changes, thereby enables utilization of the complete supply voltage range for example between 2.5V to 5.5V. As discussed above, with the increase of voltage, the amount of current consumed can be reduced.

In this way, the common mode output voltage of Vop and Von of the driver stages 410, 420, which drive the antenna 330, are modulated to track the changes in the supply voltage. When the reference voltage Vref is set to be equal to half of the supply voltage, then the common mode feedback stage 430 regulates each of the driver stages outputs Vop and Von to be at half the supply voltage and swing around the opposite (phase) cycle of the input signal Vin. In particular, the above configuration allows the driver stage output Vop to swing from Vref to the positive rail of the supply voltage at the same time as driver stage output Von swings from Vref to the negative rail of the supply voltage while driving the antenna to output the magnetic field. A person skilled in the art will appreciate that, across the complete range (2.5V to 5.5V) of the supply (battery) voltage, the outputs Vop, Von of the driver stages 410, 420 are able to drive the antenna 300 to output the magnetic field at a given power by using a lower amount of current with respect to the amount of current required to output the same magnetic field when the power amplifier 230 is powered by the LDO 210 which always has a certain voltage drop across. This lower current consumption in the overall design allows more efficient operation of the same which is not possible in the conventional topology shown in FIG. 2. The elimination of the LDO will also reduce the overall cost of the system.

In an exemplary embodiment, the power amplifier driver 350 which drives the power amplifier 330 also has the same topology as the power amplifier 330 in that power amplifier driver 350 includes a pseudo-differential amplifier including complementary driver stages, a common mode (CM) feedback stage, and biasing circuitry.

The shunt feedback resistors R5, R8 connected between the outputs Vop, Von and the inputs Vin of the driver stages 410, 420 allow the matching of impedances between the antenna 300 and the power amplifier 330. Specifically, the output impedance of the topology shown in FIG. 4 is based on (altering) the values of the shunt feedback resistors R5, R8, the gains (gm) of the LDMOS transistors used in the various stages, and the output impedance of the power amplifier driver 350. In an exemplary embodiment, the input impedance of an antenna is matched to the output impedance of the power amplifier. As discussed above, because of the availability of a higher voltage range, the current required to output the magnetic field at the given power is reduced. This reduction allows for the desirable increase in the input impedance of the antenna, which is desired because it makes the impedance matching less severe. In this way, the reduction of the required current not only improves the overall current consumption of the design, but also allows for an easier impedance matching between the antenna and the power amplifier without sacrificing the strength of the output magnetic field.

It is to be appreciated that the Detailed Description section, and not the Abstract section, is intended to be used to interpret the claims. The Abstract section may set forth one or more but not all exemplary embodiments of the present invention as contemplated by the inventor(s), and thus, is not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It should be noted that any exemplary processes described herein can be implemented in hardware, software, or any combination thereof. For instance, the exemplary process can be implemented using computer processors, computer logic, application specific circuits (ASICs), digital signal processors (DSP), etc., as will be understood by one of ordinary skill in the arts based on the discussion herein.

Moreover, any exemplary processes discussed herein can be embodied by a computer processor or any one of the hardware devices listed above. The computer program instructions cause the processor to perform the processing functions described herein. The computer program instructions (e.g., software) can be stored in a computer useable medium, computer program medium, or any storage medium that can be accessed by a computer or processor. Such media include a memory device such as a computer disk or CD ROM, or the equivalent. Accordingly, any computer storage medium having computer program code that causes a processor to perform the processing functions described herein are with the scope and spirit of the present invention.

The breadth and scope of the present invention should not be limited by any of the above-described exemplary embodiments, but should be defined only in accordance with the following claims and their equivalents.

What is claimed is:

1. A power amplifier, supplied by a supply voltage, to drive an antenna to output a magnetic field, comprising:
   a differential stage configured to output an output signal to drive the antenna; and
   a feedback stage configured to receive a common mode voltage from the differential stage and to output a feedback voltage to regulate the common mode voltage of the output signal to be proportional to the supply voltage.

2. The power amplifier of claim 1, wherein the differential stage comprises:
   a positive stage configured to output a positive signal of the output signal to drive the antenna during a positive half cycle of an input signal; and
   a negative stage configured to output a negative signal of the output signal to drive the antenna during a negative half cycle of the input signal.

3. The power amplifier of claim 2, wherein the common mode voltage is derived from the positive signal and the negative signal.

4. The power amplifier of claim 2, wherein the output signal is centered at the reference voltage to allow the positive signal to swing between the reference voltage and a maximum supply voltage and to allow the negative signal to swing between the reference voltage and a minimum supply voltage.

5. The power amplifier of claim 1, wherein
   the feedback stage is configured to compare the common mode voltage and a reference voltage generated based on the supply voltage to output the feedback voltage, and
   wherein the differential stage is configured to modulate the output signal in accordance with the feedback voltage.

6. The power amplifier of claim 1, wherein an amplitude of the output signal changes in accordance with changes in the supply voltage.

7. The power amplifier of claim 1, wherein the differential stage and the feedback stage include laterally diffused metal oxide semiconductor (LDMOS) devices.

8. The power amplifier of claim 1, wherein the differential stage comprises:

a transistor, and
wherein the feedback stage is applied to a gate of the transistor to regulate the common mode voltage.

9. A near field communication (NFC) device, comprising:
a power amplifier, supplied by a supply voltage, configured to drive an antenna to output a magnetic field for communicating with a second NFC device, the power amplifier including:
a differential stage configured to output an output signal to drive the antenna; and
a feedback stage configured to receive a common mode voltage from the differential stage and to output a feedback voltage to regulate the common mode voltage of the output signal to be proportional to the supply voltage.

10. The NFC device of claim 9, wherein the differential stage comprises:
a positive stage configured to output a positive signal of the output signal to drive the antenna during a positive half cycle of an input signal; and
a negative stage configured to output a negative signal of the output signal to drive the antenna during a negative half cycle of the input signal.

11. The NFC device of claim 10, wherein the common mode voltage is derived from the positive signal and the negative signal.

12. The NFC device of claim 10, wherein the output signal is centered at the reference voltage to allow the positive signal to swing between the reference voltage and a maximum supply voltage and to allow the negative signal to swing between the reference voltage and a minimum supply voltage.

13. The NFC device of claim 9, wherein
the feedback stage is configured to compare the common mode output voltage and a reference voltage generated based on the supply voltage to output the feedback voltage, and
wherein the differential stage is configured to modulate the output signal in accordance with the feedback voltage.

14. The NFC device of claim 9, wherein an amplitude of the output signal changes in accordance with changes in the supply voltage.

15. The NFC device of claim 9, wherein the supply voltage is supplied by a battery powering the NFC device.

16. The NFC device of claim 9, wherein the differential stage and the feedback stage include laterally diffused metal oxide semiconductor (LDMOS) devices.

17. The near field communication (NFC) device of claim 9, wherein the differential stage comprises:
a transistor, and
wherein the feedback stage is applied to a gate of the transistor to regulate the common mode voltage.

18. A power amplifier for driving an antenna to output a magnetic field, comprising:
a differential stage, including a first stage and a second stage, configured to drive the antenna to output the magnetic field; and
a feedback stage configured to regulate a common mode voltage between a first output signal of the first stage and a second output signal of the second stage to be proportional to the supply voltage.

19. The power amplifier of claim 18, wherein the feedback stage is configured to regulate the common mode voltage to be approximately half the supply voltage.

* * * * *

UNITED STATES PATENT AND TRADEMARK OFFICE
CERTIFICATE OF CORRECTION

PATENT NO. : 8,929,808 B2
APPLICATION NO. : 13/249043
DATED : January 6, 2015
INVENTOR(S) : Marholev et al.

Page 1 of 1

It is certified that error appears in the above-identified patent and that said Letters Patent is hereby corrected as shown below:

In the Claims

Column 10, line 3, Claim 13, please replace "mode output voltage" with --mold voltage--.

Signed and Sealed this
Twelfth Day of May, 2015

Michelle K. Lee
*Director of the United States Patent and Trademark Office*